(12) United States Patent
Kimura

(10) Patent No.: US 6,812,787 B2
(45) Date of Patent: Nov. 2, 2004

(54) REFERENCE VOLTAGE GENERATING CIRCUIT AND VOLTAGE AMPLIFIER USING THE SAME

(75) Inventor: Hiroshi Kimura, Hyogo (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/395,072

(22) Filed: Mar. 25, 2003

(65) Prior Publication Data

US 2003/0184370 A1 Oct. 2, 2003

(30) Foreign Application Priority Data

Mar. 26, 2002 (JP) .................................... 2002-085969

(51) Int. Cl.[7] .............................................. H03F 3/45
(52) U.S. Cl. ............................................... 330/69; 330/9
(58) Field of Search ............................ 330/9, 51, 59, 330/69, 38; 327/124

(56) References Cited

U.S. PATENT DOCUMENTS

| | | | | |
|---|---|---|---|---|
| 5,307,196 A | * | 4/1994 | Kinoshita | 327/63 |
| 5,612,810 A | * | 3/1997 | Inami et al. | 330/59 |
| 5,875,049 A | * | 2/1999 | Asano et al. | 330/59 |
| 5,923,219 A | * | 7/1999 | Ide et al. | 330/308 |
| 6,072,362 A | * | 6/2000 | Lincoln | 330/10 |

FOREIGN PATENT DOCUMENTS

JP 06310967 11/1994

* cited by examiner

*Primary Examiner*—Khanh Van Nguyen
(74) *Attorney, Agent, or Firm*—McDermott Will & Emery LLP

(57) ABSTRACT

In a reference voltage generating circuit, in a first period, only a first switch is OFF and a maximum peak value Vmax of an input signal In is held at a node A of a first capacitor 1. Next, in a second period, a second and a third switches are opened, and a voltage difference between the maximum peak value Vmax and a minimum peak value Vmin is held at a node C of a capacitor string. At this time, the voltage held in a second capacitor of the capacitor string is added to the voltage held in the first capacitor, and the voltage at a node B is output as a reference voltage Vref. The input signal In is applied to one input terminal of a differential amplifying circuit, and the reference voltage Vref is applied to the other input terminal. When the voltages held at the nodes A and C have stabilized, the reference voltage Vref is generated. Accordingly, there is provided a voltage amplifier that can amplify input signals having a variety of signal amplitudes to a constant amplitude by using the reference voltage generating circuit with excellent high-speed response.

21 Claims, 14 Drawing Sheets

REFERENCE VOLTAGE GENERATING CIRCUIT AND VOLTAGE AMPLIFIER USING THE SAME

BACKGROUND OF THE INVENTION

The present invention relates to a voltage amplifier for amplifying input signals having a variety of signal amplitudes, such as a signal obtained through current/voltage conversion of an output current from a photodiode that receives an optical signal from an optical fiber, to a constant amplitude in optical communications systems such as a PDS Passive Double Star) optical subscriber system.

In recent years, vigorous studies have been carried out on optical subscriber systems in order to realize future FTTH (Fiber To The Home) services. However, the introduction of an optical fiber, which has extremely large transmission capacity, to households presents the problem that it is less cost effective than conventional metallic cables. Under this circumstance, the PDS optical subscriber system is considered promising from the viewpoint of cost effectiveness, since it has enabled a two-way communications service to a plurality of subscribers by splitting a single optical fiber supplied by the station side.

In such an optical communications system, as the distances between individual households and the station differ from one another, so do the optical fiber transmission distances. The attenuation of light also varies between them, and signals obtained through photoelectric conversion at an optical link section of a light receiving device, are turned into voltage signals having a variety of amplitudes, including signals having a very small amplitude and signals having a large amplitude. In order to extract clocks and data from these voltage signals, it is necessary to amplify the signals to voltage signals having a constant amplitude of a level at which digital processing is possible.

However, if the gain is set high for input signals having a small amplitude when amplifying the signals with a commonly used amplifier, an offset causes saturation of the output, or the output signal saturates and greatly distorts the waveform when signals having a large amplitude are input, thereby making it impossible to extract clocks and data.

In view of this, there has been proposed an amplifying circuit as disclosed in Japanese Laid Open Patent Publication No. 6-310967. In the configuration of this amplifying circuit, a peak value and a bottom value of an input signal are each detected and held, and an intermediate voltage value of these values and the input signal are input to an amplitude limiting amplifier.

The amplifying circuit proposed by the above-mentioned publication, however, requires two peak detecting circuits, namely, a peak value detecting-and-holding circuit and a bottom value detecting-and-holding circuit, resulting in increased power consumption. Furthermore, it also requires a circuit for dividing the output voltages of the above-mentioned circuits. In order to increase the response speed of this voltage dividing circuit, it is necessary to decrease the value of the resistance used for the voltage division, promoting the increase of power consumption further.

Additionally, a time period in which the intermediate voltage of the peak value and the bottom value is generated and stabilized is the sum of a time period in which the output of each of the peak value detecting-and-holding circuit and the bottom value detecting-and-holding circuit is stabilized and a time period in which the output of the voltage dividing circuit is stabilized, so that there is the problem of a significant time delay.

SUMMARY OF THE INVENTION

Therefore, with the foregoing in mind, it is an object of the present invention to provide a reference voltage generating circuit with low power consumption that is excellent in the high-speed response performance, and a voltage amplifier that uses the same to amplify input signals having a variety of signal amplitudes to a constant amplitude.

In order to solve the above-mentioned object, according to the present invention, a reference voltage between the maximum peak value and the minimum peak value of an input signal is automatically generated at the time when these peak values are detected.

More specifically, the present invention provides a reference voltage generating circuit wherein a signal is input, a maximum peak value or minimum peak value of the input signal in a first period is detected and held as a first peak value, a minimum peak value or maximum peak value of the input signal in a second period different from the first period is detected and held as a second peak value, and a voltage between the first peak value and the second peak value is output as a reference voltage.

According to the present invention, the reference voltage generating circuit comprises: a first capacitor; and a capacitor string comprising a cascade connection of a second and a third capacitor, wherein: the first peak value is held in the first capacitor, and a voltage difference between the first peak value and the second peak value is held in the capacitor string; and a voltage held in the second capacitor is added to a voltage held in the first capacitor, and the voltage thus obtained is output as a reference voltage.

According to the present invention, in the reference voltage generating circuit, a capacitance value of the second capacitor and a capacitance value of the third capacitor are equal.

According to the present invention, in the reference voltage generating circuit, the first capacitor and the capacitor string are cascade-connected.

According to the present invention, in the reference voltage generating circuit, a capacitance value of the first capacitor is sufficiently larger than the capacitance values of the second and the third capacitors.

The present invention also provides a reference voltage generating circuit comprising: a first capacitor; a capacitor string comprising a cascade connection of a second and a third capacitor; a voltage/current converting circuit for outputting a current corresponding to a voltage difference between two input voltages input to two input terminals; a unidirectionally-conductive element for passing a current only in one direction; a buffer circuit; and first and second reset circuits, wherein: an output terminal of the voltage/current converting circuit is connected to one end of the unidirectionally-conductive element; the other end of the unidirectionally-conductive element is connected to one end of the capacitor string and to an input terminal of the buffer circuit; the other end of the capacitor string is connected to one end of the first capacitor; a predetermined voltage is applied to the other end of the first capacitor; an output terminal of the buffer circuit is connected to one input terminal of the voltage/current converting circuit, and a signal is input to the other input terminal of the voltage/current converting circuit; the first reset circuit discharges an electric charge of the first capacitor; and the second reset circuit discharges electric charges of the second and third capacitors constituting the capacitor string.

The present invention provides a reference voltage generating circuit comprising: a voltage generating circuit for generating a predetermined voltage; and a capacitor string comprising a cascade connection of two capacitors, wherein: one end of the capacitor string is connected to an output terminal of the voltage generating circuit, and a peak value of an input signal is detected and held on the other end of the capacitor string; and a voltage at a node connecting the two capacitors constituting the capacitor string is output as a reference voltage.

According to the present invention, in the reference voltage generating circuit, capacitance values of the two capacitors constituting the capacitor string are equal to each other.

The present invention also provides a reference voltage generating circuit comprising: a voltage generating circuit for generating a predetermined voltage; a capacitor string comprising a cascade connection of two capacitors; a voltage/current converting circuit for outputting a current corresponding to a voltage difference between two input voltages input to two input terminals; a unidirectionally-conductive element for passing a current only in one direction; a buffer circuit; and a reset circuit, wherein: an output terminal of the voltage/current converting circuit is connected to one end of the unidirectionally-conductive element; the other end of the unidirectionally-conductive element is connected to one end of the capacitor string and to an input terminal of the buffer circuit; the other end of the capacitor string is connected to an output terminal of the voltage generating circuit; an output terminal of the buffer circuit is connected to one input terminal of the voltage/current converting circuit; a signal is input to the other input terminal of the voltage/current converting circuit; and the reset circuit discharges electric charges of the two capacitors constituting the capacitor string.

The present invention provides a voltage amplifier comprising: the above-described reference voltage generating circuit; and a differential amplifying circuit for outputting an output voltage corresponding to a voltage difference between two input voltages input to two input terminals, wherein: an input signal is applied to the reference voltage generating circuit and to one input terminal of the differential amplifying circuit; and a reference voltage output from the reference voltage generating circuit is applied to the other input terminal of the differential amplifying circuit.

The present invention also provides a voltage amplifier comprising: the above-described voltage amplifier serving as a first voltage amplifying circuit; and at least one second voltage amplifying circuit, wherein: the second voltage amplifying circuit comprises a sample-and-hold circuit and a differential amplifying circuit; an input voltage to the second voltage amplifying circuit is applied to the sample-and-hold circuit and to one input terminal of the differential amplifying circuit; and an output voltage from the sample-and-hold circuit is applied to the other input terminal of the differential amplifying circuit.

According to the present invention, in the voltage amplifier, the one second voltage amplifying circuit or a plurality of cascade-connected second voltage amplifying circuits are cascade-connected in a stage subsequent to the first voltage amplifying circuit.

According to the present invention, the voltage amplifier further comprises an offset correcting circuit, wherein the offset correcting circuit is cascade-connected in a final stage.

According to the present invention, in the voltage amplifier, the offset correcting circuit comprises: a differential amplifying circuit having a first and a second differential input terminal; and a first and a second peak detecting circuit, wherein: a first and a second signals are input; a peak value of the first input signal is detected and held by the first peak detecting circuit, and the first input signal and its peak value are input as a first differential signal to the first differential input terminal of the differential amplifying circuit; and a peak value of the second input signal is detected and held by the second peak detecting circuit, and the second input signal and its peak value are input as a second differential signal to the second differential input terminal of the differential amplifying circuit.

According to the present invention, in the voltage amplifier, the offset correcting circuit comprises: a differential amplifying circuit having a first and a second differential input terminal; and a first and a second peak detecting circuit, wherein: a first and a second signals are input; the first and second input signals are input as a first differential signal to the first differential input terminal of the differential amplifying circuit, and peak values of the first and second input signals are detected and held by the first and second peak detecting circuits, respectively, and output signals of the first and second peak detecting circuits are input as a second differential signal to the second input terminal of the differential amplifying circuit.

According to the present invention, in the voltage amplifier, a response-delay circuit for delaying detection and holding of the peak values of the first and second input signals is connected to the first and second peak detecting circuits of the offset correcting circuit.

According to the present invention, the voltage amplifier further comprises a comparator, wherein the comparator is configured so as to be able to amplify a differential voltage input to the comparator to a voltage having a constant amplitude, and also to receive a control signal and fix its output voltage value.

According to the present invention, in the voltage amplifier, an output of the differential amplifying circuit is amplitude-limited.

According to the present invention, the voltage amplifier comprises: a delay circuit, wherein the delay circuit provides a time delay between a reset signal to the reference voltage generating circuit of the first voltage amplifying circuit and a control signal of the sample-and-hold circuit of the second voltage amplifying circuit.

According to the present invention, the voltage amplifier comprises a delay circuit, wherein the delay circuit provides a time delay between a control signal of first and second sample-and-hold circuits of the second voltage amplifying circuit and a reset signal for the first and second peak detecting circuits of the offset correcting circuit.

According to the present invention, the voltage amplifier comprises a delay circuit, wherein the delay circuit provides a time delay between a reset signal for the first and second peak detecting circuits of the offset correcting circuit and a control signal of the comparator.

As described above, according to the present invention, a reference voltage is automatically generated at the time when the output of the reference voltage generating circuit has been settled, so that it is possible to generate a reference voltage at higher speed than conventional configurations, in which a reference voltage is generated by dividing a detected peak voltage with a voltage divider in a subsequent stage. Furthermore, since only one peak detecting circuit is necessary, it is also possible to reduce power consumption.

In particular, according to the present invention, the first and second peak values and the reference voltage are generated with a configuration in which three capacitors, namely, the first, second and third capacitors, are provided and the capacitor holding the voltage is switched from one of the capacitors to another, so that the reference voltage is generated with a simple configuration.

According to the present invention, since the capacitance values of the second and the third capacitors are equal to each other, an intermediate voltage of the first peak value and the second peak value is generated as a reference voltage.

According to the present invention, since the first capacitor and the capacitor string are cascade-connected, it is possible to readily generate a reference voltage with low power consumption.

According to the present invention, since the capacitance value of the first capacitor is sufficiently larger than the capacitance values of the second and the third capacitors, an offset error is suppressed at a low level.

Moreover, according to the present invention, when the input signal is a constant value in a first period, the constant voltage of the input signal can be generated by the voltage generating circuit. This eliminates the need for the first capacitor and a reset signal for discharging the electric charge of this capacitor, so that it is possible to generate a reference voltage at high speed with low power consumption by using a simpler configuration.

In particular, according to the present invention, since the capacitance values of the second and third capacitors are set equal to each other, a voltage that is exactly in the middle of the output voltage of the voltage generating circuit and the voltage held as the peak is generated.

According to the present invention, an input signal and a reference voltage that is the center voltage of the amplitude of this signal are applied to the two input terminals of the differential amplifying circuit, so that the input signal is amplified with low distortion.

According to the present invention, in the second voltage amplifying circuit, a voltage is held as the reference voltage in the sample-and-hold circuit before inputting a signal, so that a signal input thereafter is amplified with low distortion in the differential amplifying circuit.

According to the present invention, one second voltage amplifying circuit or a plurality of cascade-connected second voltage amplifying circuits are additionally cascade-connected in a stage subsequent to the first voltage amplifying circuit, so that the input signal is amplified with low power consumption and high gain.

According to the present invention, since the offset correcting circuit is cascade-connected in the final stage of the voltage amplifier, it is possible to effectively cancel an offset, thereby suppressing duty ratio deterioration due to an offset at low level.

According to the present invention, it is possible to easily cancel an offset with a simple configuration.

According to the present invention, a response-delay circuit is additionally provided with the peak detecting circuits of the offset correcting circuit, so that even when there is an extraordinary peak in the first bit, it is possible to detect a normal peak value without detecting this extraordinary peak.

According to the present invention, since a differential input voltage is amplified to a voltage having a constant amplitude with the comparator, it is possible to obtain a digital signal having an amplitude of a logic level, as well as suppressing the variation or fluctuation of the output signal due to a noise and the like.

According to the present invention, since the differential amplifying circuit is configured such that its output is amplitude-limited, even input signals having a large amplitude do not saturate, making it possible to obtain an output with little duty ratio deterioration.

According to the present invention, the reset operation is first performed for the reference voltage generating circuit of the first voltage amplifying circuit in a previous stage, then for the sample-and-hold circuit of the second voltage amplifying circuit, and then for the comparator, so that it is possible to realize a stable operation, thereby obtaining a highly accurate output.

DETAILED DESCRIPTION OF THE INVENTION

Hereinafter, preferred embodiments of the invention are described with reference to the appended drawings.

Embodiment 1

Figure 1:
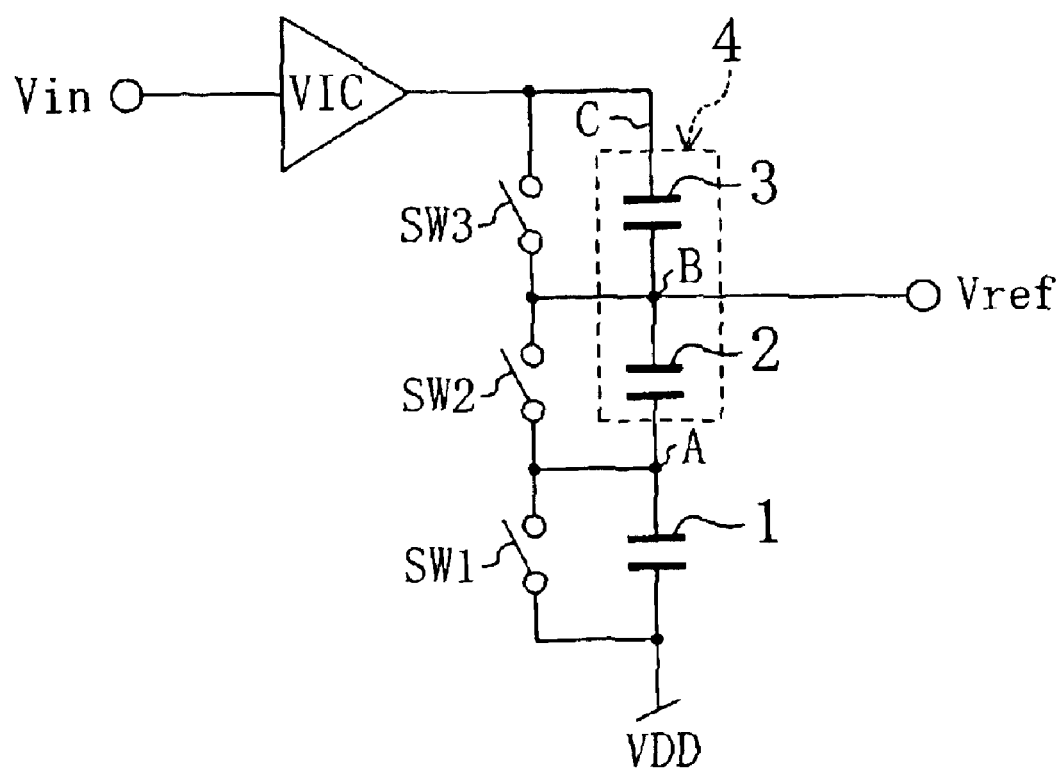
FIG. 1 is a diagram showing a reference voltage generating circuit according to Embodiment 1 of the present invention.

FIG. 1 shows a reference voltage generating circuit according to Embodiment 1 of the present invention.

In the figure, one end of a first capacitor 1 is grounded (here, it is assumed that VDD denotes a predetermined voltage and the first capacitor 1 serves as a minimum hold circuit), and other end thereof is cascade-connected to a capacitor string 4 comprising a cascade connection of second and third capacitors 2 and 3. Switches SW1, SW2 and SW3 are connected in parallel to the capacitors 1, 2 and 3, respectively. These switches SW1 to SW3 serve to release an electric charge by short-circuiting the two ends of the capacitors 1 to 3, respectively. Additionally, VIC denotes a voltage/current converting circuit, to whose input side an input voltage signal Vin is input and to whose output side a circuit comprising a cascade connection of the first capacitor 1 and the capacitor string 4 is connected, serving to charge (or discharge) the capacitors 1 to 3 until the input voltage Vin becomes equal to the output voltage.

Figure 12:
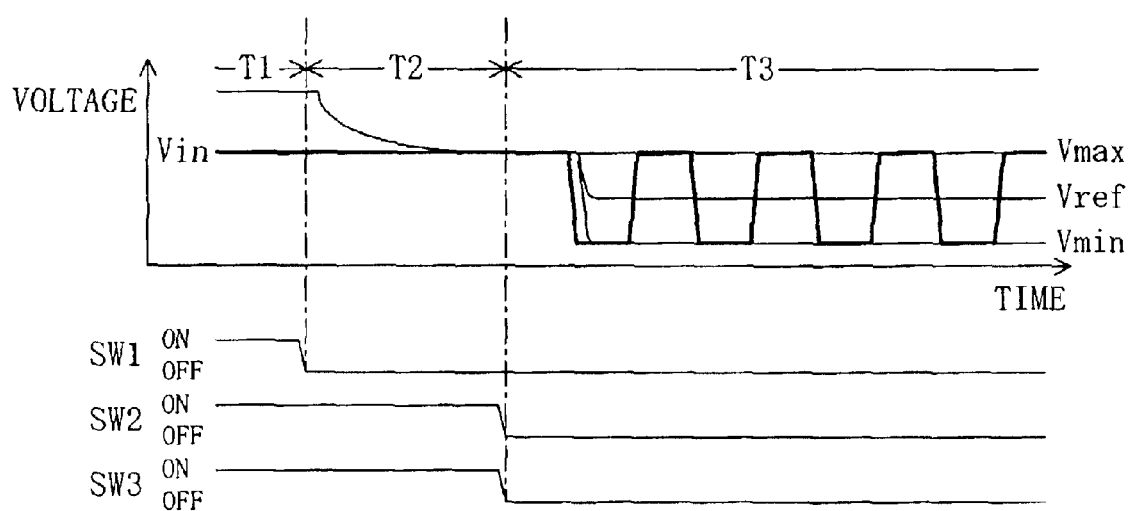
FIG. 12 is a diagram illustrating the operation of the reference voltage generating circuit according to Embodiment 1 of the present invention.

In the following, the specific operation of the reference voltage generating circuit shown in FIG. 1 is described with reference to FIG. 12. It should be noted that in the following description, the point where the first and second capacitors 1 and 2 are connected is referred to as a node A, the point where the second and third capacitors 2 and 3 are connected is referred to as a node B and the point where the third capacitor 3 and the voltage/current converting circuit VIC are connected is referred to as a node C, as shown in FIG. 1.

(1) Reset period T1: a period in which all of the switches SW1 to SW3 are ON, and the electric charges of all of the capacitors 1 to 3 are discharged. Consequently, each of the node A, node B and node C is fixed at the potential VDD.

(2) First period T2: a period in which only the switch SW1 is OFF and the first capacitor 1 serves as a hold capacitor. Consequently, a high-potential voltage (first peak value) Vmax of the input signal Vin is held in the first capacitor 1, that is, the node A. Since the switches SW2 and SW3 are still ON, each of the nodes A, B and C has the high-potential side voltage Vmax.

(3) Second period T3: a period which follows the first period T2 and in which the switches SW2 and SW3 are opened, and the cascade connection of the first, second and third capacitors 1, 2 and 3 serves as a hold capacitor. If the input signal Vin shifts to the low-potential side in this period, its peak value (second peak value) Vmin is held at the node C, and the voltage difference (Vmax−Vmin) between the two peak values Vmax and Vmin is held in the capacitor string 4.

Let us now consider the potential of the reference voltage Vref generated at the node B at this time. First, in the first period T2, the output voltage Vmax when no signal is input is detected, and this voltage Vmax is held in the first capacitor 1. At this time, the second and third capacitors 2 and 3 are discharged. Accordingly, taking the capacitance values of the first, second and third capacitors 1, 2 and 3 as C1, C2 and C3, respectively, the voltages held by them as V1, V2 and V3, respectively, and the amounts of electric charge stored by them as Q1, Q2 and Q3, respectively, the following equations hold:

$$Q1 = C1 \cdot V1 = C1 \cdot V\text{max}$$

$$Q2 = C2 \cdot V2 = 0$$

$$Q3 = C3 \cdot V3 = 0$$

Next, in the second period T3, the output voltage Vmin when a maximum signal is input is sampled and held, with the first to third capacitors 1 to 3 connected in series. At this time, when the transferred charge is expressed as q, the following equation holds:

$$(Q1+q)/C1 + q/C2 + q/C3 = V\text{min}$$

$$\therefore q = (V\text{min} - Q1/C1) \cdot C4$$

where $1/C4 = (1/C1 + 1/C2 + 1/C3)$

Accordingly, the reference voltage Vref is as follows:

$$V\text{ref} = V\text{min} - (C4/C3)(V\text{min} - V\text{max})$$

Here, when C2=C3, C1=K·C2 (K is a natural number), the following equation holds:

$$V\text{ref} = V\text{min} - (1/(2+1/K))(V\text{min} - V\text{max})$$

$$= (V\text{min} + V\text{max})/2 + (1/4K)(V\text{min} - V\text{max})$$

$$= (V\text{min} + V\text{max})/2 + \Delta V$$

where $\Delta V = (\frac{1}{4}K)(V\text{min} - V\text{max})$

From the above equation, it can be seen that making K>>1 gives a voltage in which the voltage held in the second capacitor 2 ((Vmax−Vmin)/2) is added to the voltage Vmax held on the high-potential side, that is, the intermediate voltage of the two peak values Vmin and Vmax, (Vmin+Vmax)/2.

As described above, according to the present embodiment, the reference voltage Vref is automatically generated at the time when the output of the reference voltage generating circuit has been settled, so that it is possible to generate the reference voltage Vref at higher speed than the conventional configurations, in which a reference voltage is generated by dividing a detected peak voltage with a voltage divider in a subsequent stage. Furthermore, since only one peak detecting circuit is necessary, power consumption can be effectively reduced.

Embodiment 2

Figure 2:
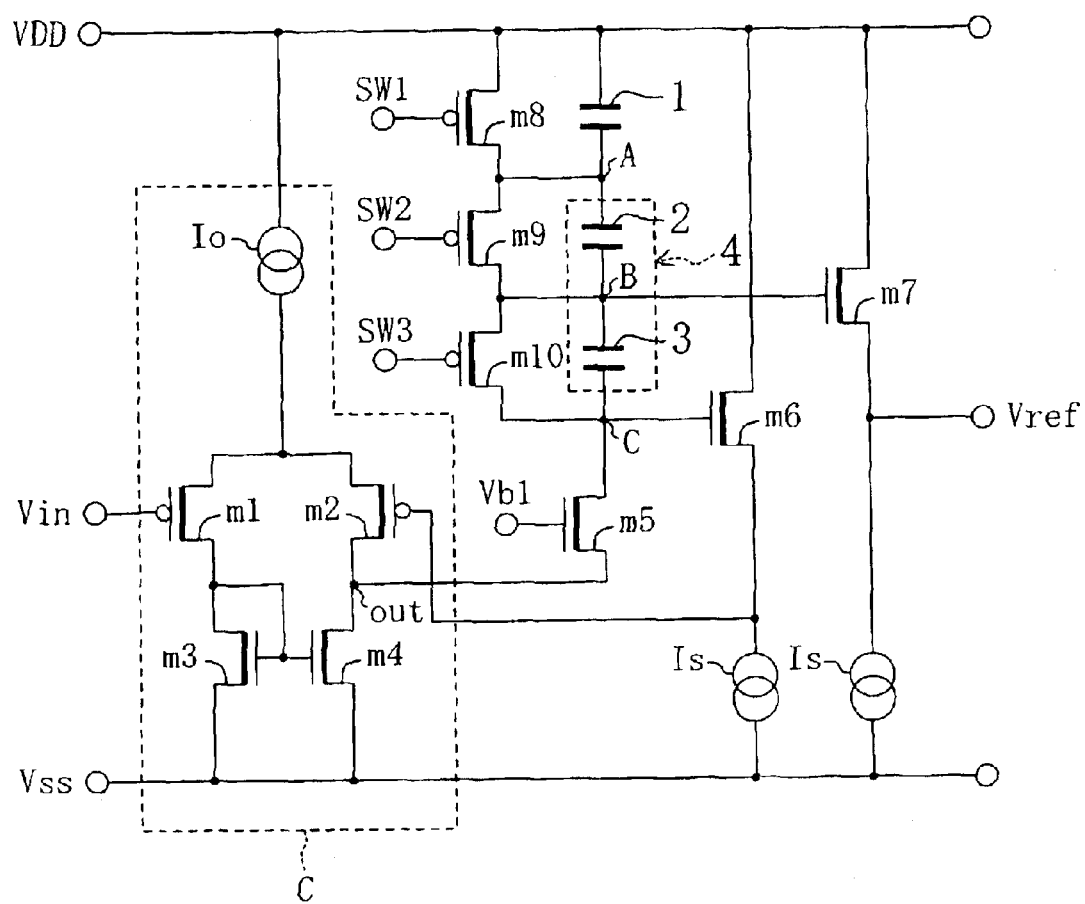
FIG. 2 is a diagram showing a reference voltage generating circuit according to Embodiment 2 of the present invention.

FIG. 2 shows a reference voltage generating circuit according to Embodiment 2 of the present invention.

The reference voltage generating circuit shown in FIG. 2 is provided with the first capacitor 1 and the capacitor string 4 comprising a cascade connection of the second and third capacitors 2 and 3, which are shown in FIG. 1, and a voltage/current converting circuit C. Additionally, m5 denotes a cascode transistor serving as a unidirectionally-conductive element for passing a current only in one direction, m6 denotes a NMOS source follower transistor serving as a buffer circuit, m8 denotes a PMOS transistor serving as a first reset circuit that is connected in parallel to the first capacitor 1, and m9 and m10 are PMOS transistors serving as a second reset circuit that are connected in parallel to the second and third capacitors 2 and 3, respectively.

The voltage/current converting circuit C is made of a differential circuit comprising a PMOS transistor pair m1 and m2, which is biased by a bias current source Io and whose sources are coupled together, and NMOS transistors m3 and m4, with the gate terminals of the two PMOS transistors m1 and m2 serving as two input terminals. An output terminal out of the voltage/current converting circuit C is connected to one end of the cascode transistor m5, and the other end of the cascode transistor m5 is connected to one end of the capacitor string 4 and to a gate serving as the input terminal of the NMOS source follower transistor m6. The other end of the capacitor string 4 and one end of the first capacitor 1 are connected at the node A, and the predetermined voltage VDD is applied to the other end of the first capacitor 1.

Further, the source (the output terminal) of the NMOS source follower transistor m6 is connected to one input terminal of the voltage/current converting circuit C (that is, the gate of the PMOS transistor m2), and the input signal Vin is input to the gate of the PMOS transistor m1 serving as the other input terminal of the voltage/current converting circuit C. The PMOS transistor m8 serving as the first reset circuit discharges the electric charge of the first capacitor 1, and the PMOS transistors m9 and m10 serving as the second reset circuit discharge the electric charges of the second and third capacitors 2 and 3, respectively. The voltage of the node B, which is the point where the second capacitor 2 and the third capacitor 3 of the capacitor string 4 are connected, is output as the reference voltage Vref through the NMOS source follower transistor m7.

The reference voltage generating circuit according to the present embodiment operates as follows. First, in the reset period, each of the reset signals SW1, SW2 and SW3 is LOW, all the electric charge of each of the capacitors 1, 2 and 3 is discharged, and each of the nodes A, B and C is set to the voltage VDD. Next, in the first period, the reset signal SW1 is HIGH, the first capacitor 1 is charged until the gate voltages of the two PMOS transistors m1 and m2 of the voltage/current converting circuit C become equal, and the maximum value Vmax of the input signal Vin in the first period is detected and held. Next, in the second period, the reset signals SW2 and SW3 are also HIGH, and the minimum value Vmin of the input signal Vin in the second period is detected and held at the node C. At this point, the voltage of the node B has been stabilized, and a reference voltage Vref (=(Vmax+Vmin)/2) corresponding to the voltage of the node B is output.

Thus, according to the present embodiment, an intermediate voltage of the signal amplitude of the input signal Vin is extremely readily generated as the reference voltage Vref. Moreover, unlike the conventional configurations, this circuit configuration does not require a voltage divider that divides a voltage with resistances, so that it is possible to generate the reference voltage Vref at high speed with low power consumption.

It should be noted that in the present embodiment, the configuration was based on a minimum hold circuit, but the present invention is not limited to this configuration and also includes configurations employing a circuit based on a maximum hold circuit. In such a case, the polarity of all of the transistors should be reversed and the source voltage VDD and the ground VSS should be interchanged.

Embodiment 3

Figure 3:
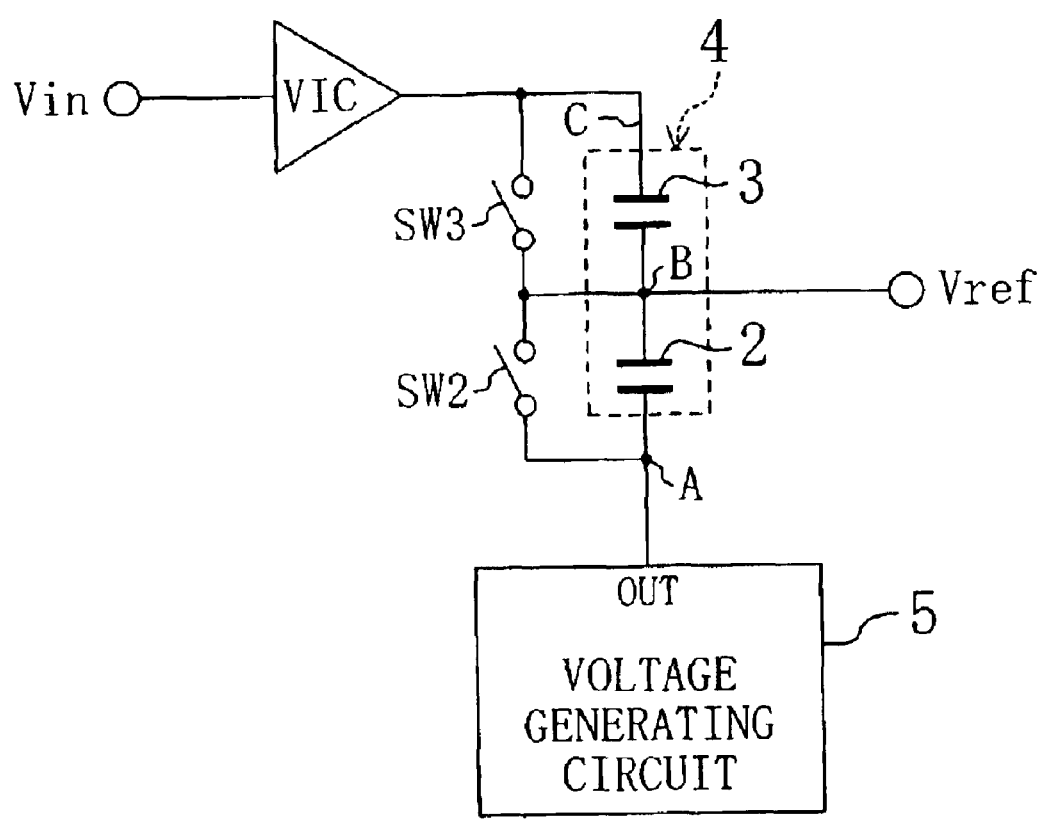
FIG. 3 is a diagram showing a reference voltage generating circuit according to Embodiment 3 of the present invention.

FIG. 3 shows a reference voltage generating circuit according to Embodiment 3 of the present invention. In the configuration of this embodiment, a voltage generating circuit 5 is provided, and this voltage generating circuit 5 is substituted for the first capacitor 1 and the switch SW1 of Embodiment 1 described above.

More specifically, in the reference voltage generating circuit in the figure, the voltage generating circuit 5 for generating a predetermined voltage is provided, together with the capacitor string 4 comprising a cascade connection of the two capacitors 2 and 3, the switches SW2 and SW3 that are connected in parallel to the capacitors 2 and 3, and the voltage/current converting circuit VIC. The output terminal of the voltage generating circuit 5 is connected to one end of one capacitor of the capacitor string 4, namely, the capacitor 2. The voltage of the node B connecting the two capacitors 2 and 3 of the capacitor string 4 is output as the reference voltage Vref. In the present embodiment, as with Embodiment 1, the capacitance values of the two capacitors 2 and 3 constituting the capacitor string 4 are also set equal to each other.

The reference voltage generating circuit according to the present embodiment is effective when the input signal Vin has a constant value in the first period, and it generates the constant voltage of the input signal in the voltage generating circuit 5 and supplies the voltage to one end of the second capacitor 2 constantly. This eliminates the need for, for example, the first capacitor 1 and a reset signal for the first capacitor 1, thereby making it possible to achieve a similar effect with a simpler configuration. Furthermore, the capacitance values of the two capacitors 2 and 3 constituting the capacitor string 4 are set equal to each other, so that a voltage exactly in the middle of the output voltage of the voltage generating circuit 5 and the voltage detected and held as the peak, is generated as the reference voltage Vref.

The reference voltage generating circuit according to the present embodiment is applicable to FIG. 2, like the configuration shown in FIG. 1. More specifically, in FIG. 2, the first capacitor 1, the transistor m8 for reset and the reset signal SW1 may be removed to give a configuration in which the output voltage of the voltage generating circuit 5 is applied to the node A.

Embodiment 4

Figure 4:
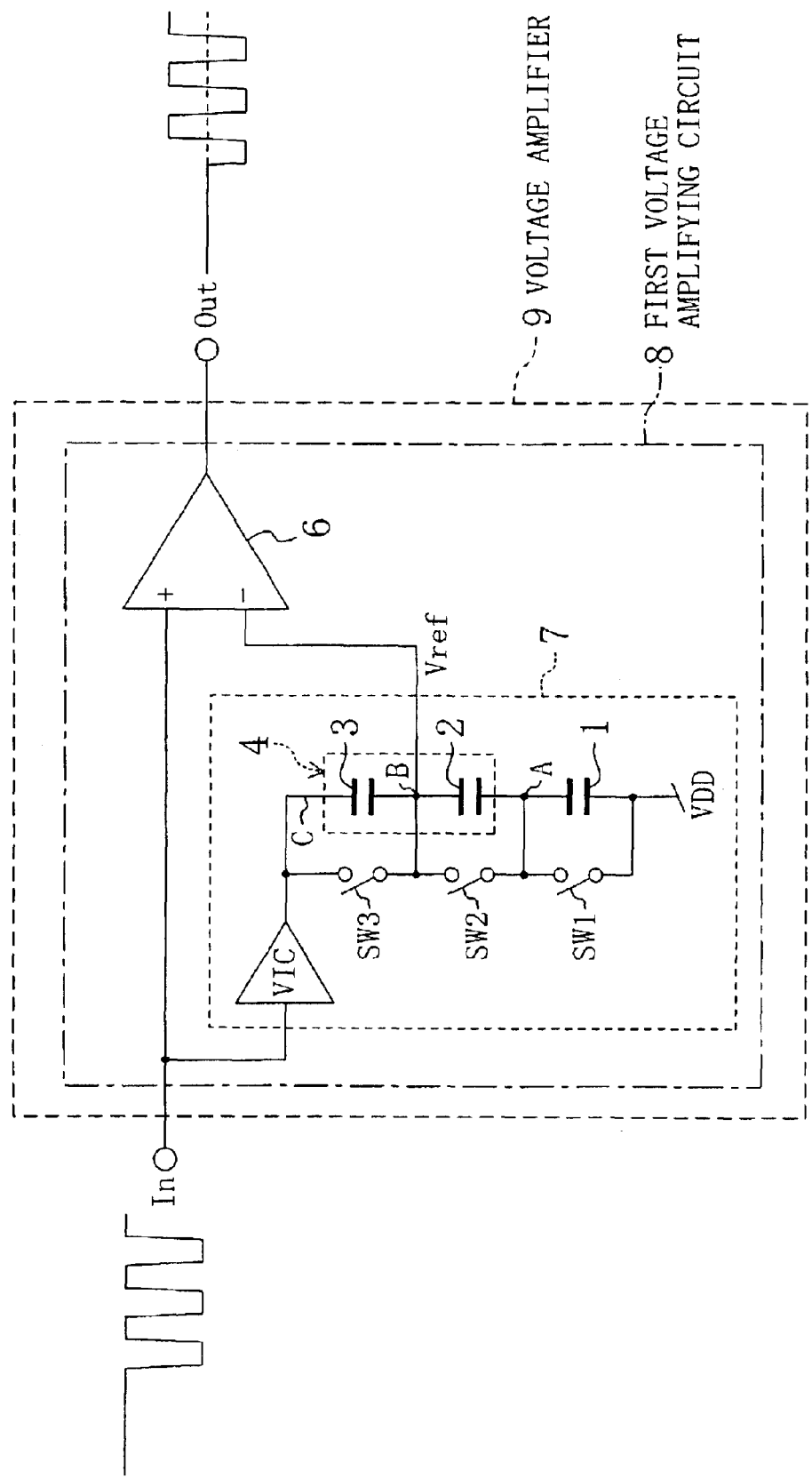
FIG. 4 is a diagram showing a voltage amplifier according to Embodiment 4 of the present invention.

FIG. 4 shows a voltage amplifier according to Embodiment 4 of the present invention.

The voltage amplifier shown in the figure is made of a first voltage amplifying circuit 8. This first voltage amplifying circuit 8 is made of a reference voltage generating circuit 7, which has the same circuit configuration as that shown in FIG. 1, and a differential amplifying circuit 6. The input signal In is input to one input terminal of the differential amplifying circuit 6 and to the input terminal of the reference voltage generating circuit 7 (that is, the voltage/current converting circuit VIC). The reference voltage Vref from the reference voltage generating circuit 7 is applied to the other input terminal of the differential amplifying circuit 6.

With the above-described configuration, the input signal In and the center voltage (reference voltage Vref) of the amplitude of the input signal In are applied to the two input terminals of the differential amplifying circuit 6, so that it is possible to amplify the input signal In with low distortion. Moreover, this configuration is simpler than the conventional configurations in that one peak detecting circuit and the voltage dividing circuit have been omitted, enabling an operation at high speed with low power consumption.

It should be noted that in the present embodiment, the reference voltage generating circuit 7 had the circuit configuration shown in FIG. 1, but it may of course have also the circuit configuration shown in FIG. 3.

Embodiment 5

Figure 5:
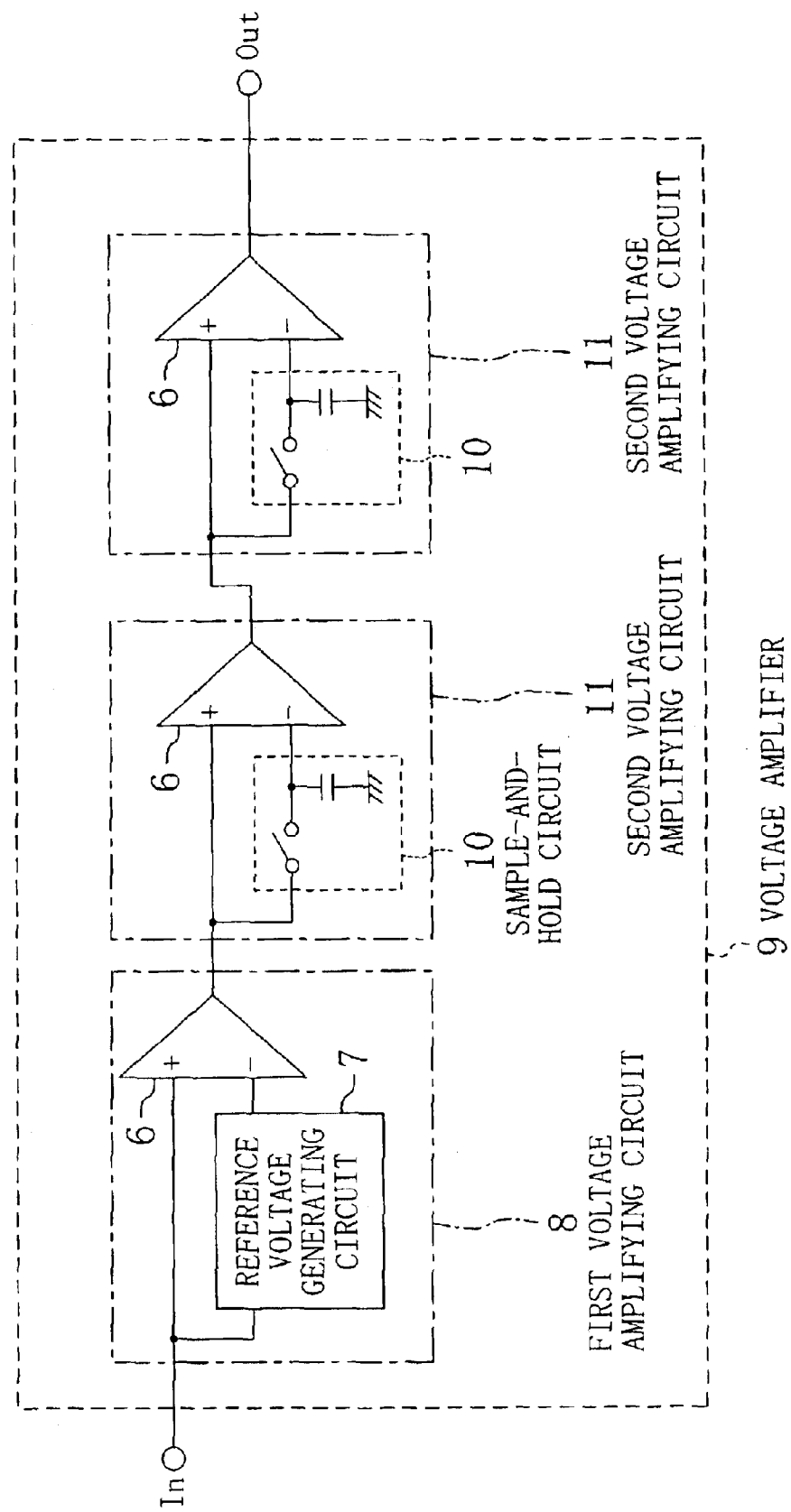
FIG. 5 is a diagram showing a voltage amplifier according to Embodiment 5 of the present invention.

FIG. 5 shows a voltage amplifier according to Embodiment 5 of the present invention.

The voltage amplifier 9 shown in the figure is provided with the first voltage amplifying circuit 8 shown in FIG. 4 and two second voltage amplifying circuits 11 that are cascade-connected. Each of the second voltage amplifying circuits 11 is made of a sample-and-hold circuit 10 and a differential amplifying circuit 6. The input signal to each of the second voltage amplifying circuits 11 is applied to one input terminal of the differential amplifying circuit 6 and to the sample-and-hold circuit 10, and the output from the sample-and-hold circuit 10 is applied to the other input terminal of the differential amplifying circuit 6.

Now, let us consider the output voltage of the first voltage amplifying circuit 8. When an input signal having a waveform as shown for the input signal In in FIG. 4 is input, the output signal of the first voltage amplifying circuit 8 has a waveform as shown for the output signal Out in FIG. 4, since the output voltage Vref of the reference voltage generating circuit 7 is shifted by exactly one half of the amplitude of the input signal In. In other words, the voltage before inputting a signal is the center of the amplitude when a signal is input. By utilizing this property, in the second voltage amplifying circuit 11, a voltage is sampled and held by the sample-and-hold circuit 10 before a signal is input, and this voltage is used as the reference voltage Vref for the differential amplifying circuit 6.

Figure 6:
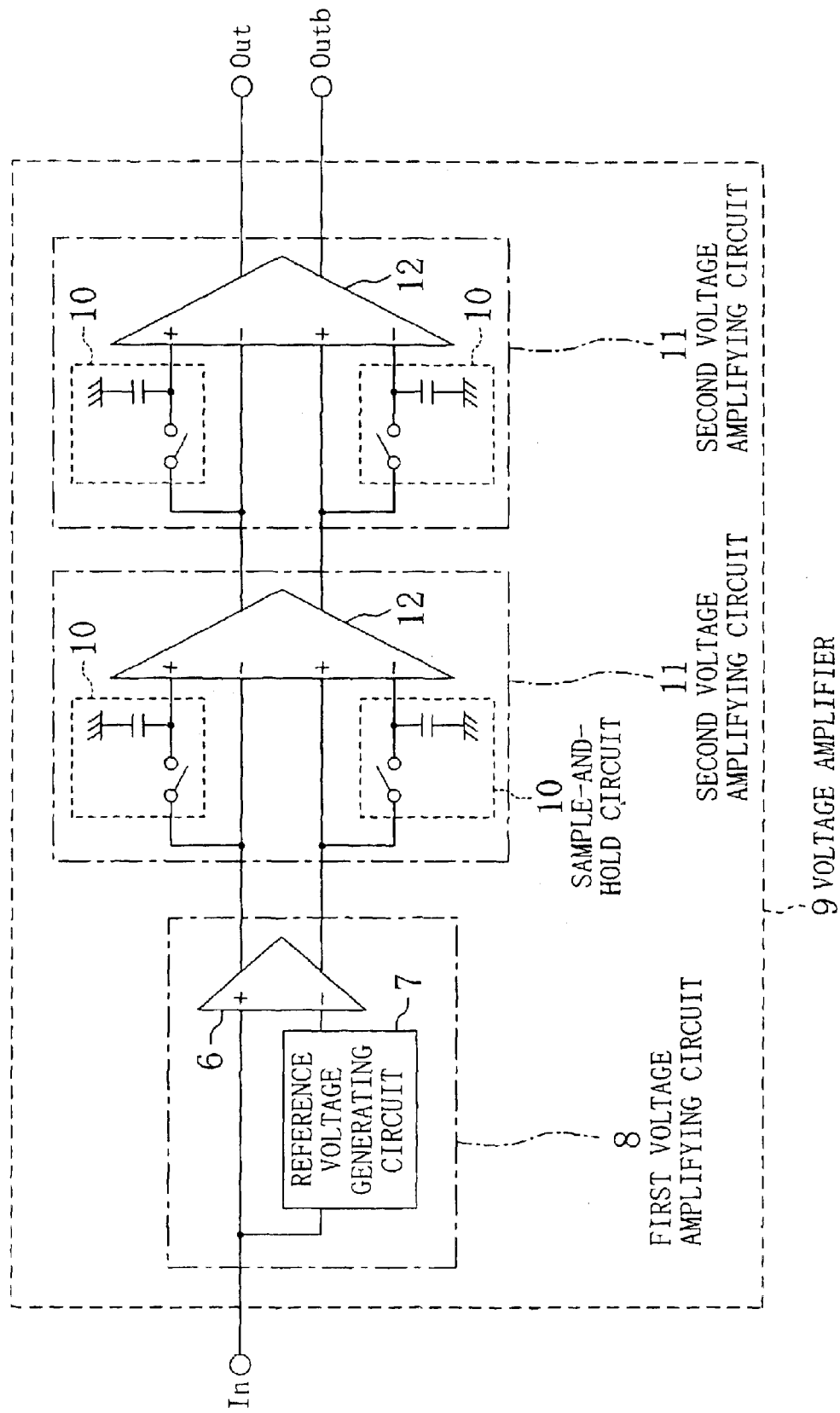
FIG. 6 is a diagram showing a modified example of the same voltage amplifier.

It should be noted that in FIG. 5, a differential amplifying circuit having a single differential input terminal is shown as an example of the differential amplifying circuit 6, but the use of a differential amplifying circuit 12 having two differential inputs, as shown in FIG. 6, allows a differential configuration, thereby making it possible to improve the noise is resistance and the voltage gain.

Additionally, although two second voltage amplifying circuit 11 were cascade-connected in the present embodiment, three or more second voltage amplifying circuits 11 may be cascade-connected, or only one second voltage amplifying circuit 11 may be provided.

Embodiment 6

Figure 7:
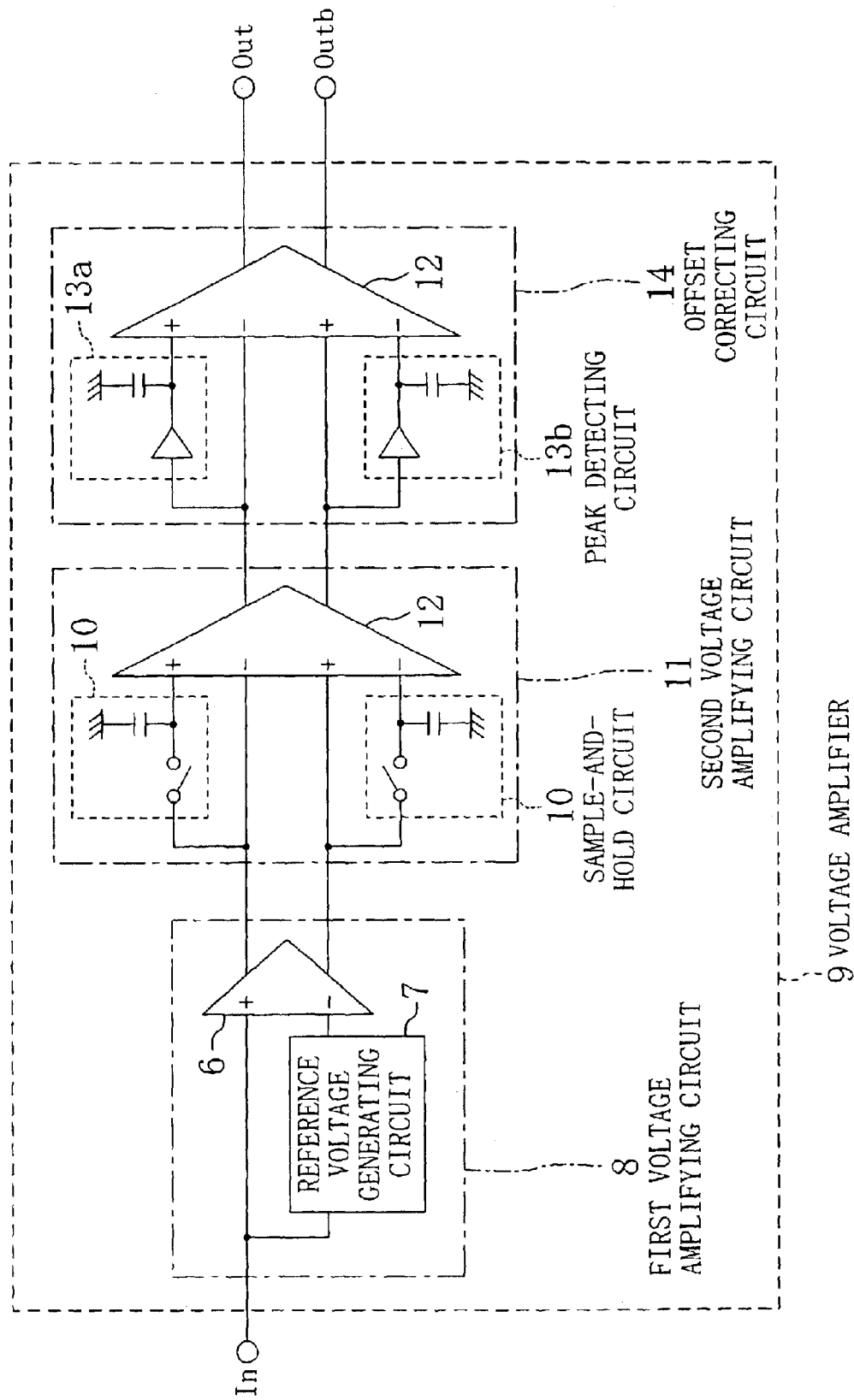
FIG. 7 is a diagram showing a voltage amplifier according to Embodiment 6 of the present invention.

FIG. 7 shows a voltage amplifier according to Embodiment 6 of the present invention. The feature of the present embodiment lies in the provision of an offset correcting circuit in the final stage.

Figure 13:
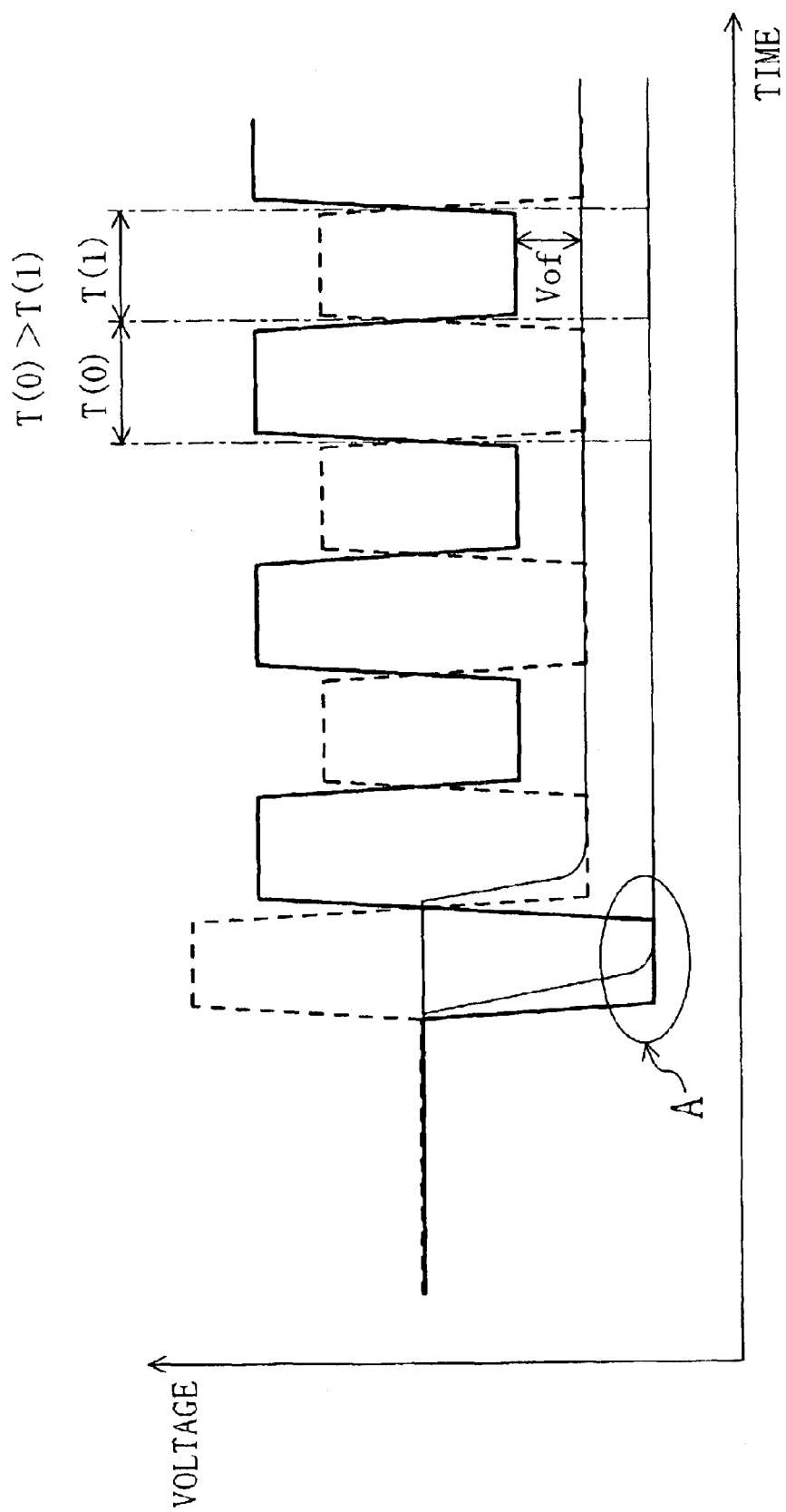
FIG. 13 is a graph showing a malfunction due to an extraordinary peak of the first bit of an input signal.

More specifically, the input signal is amplified to some extent by the first voltage amplifying circuit 8 and the second voltage amplifying circuit 11, each being part of the voltage amplifier 9 shown in the figure. However, since an offset resulting from the mismatch of the devices or the like is present between the differential input signals of this signal, duty ratio deterioration may be caused if this signal is directly amplified to a logic level all at once, as shown in FIG. 13. Therefore, as shown in FIG. 7, the present embodiment employs a configuration in which an offset correcting circuit 14 is cascade-connected in the final stage, which is the stage after the second voltage amplifying circuit 11.

The offset correcting circuit 14 is made of a differential amplifying circuit 12 having first and second differential input terminals, and first and second peak detecting circuits 13a and 13b. As shown in FIG. 7, the differential signal of the differential amplifying circuit 12 of the second voltage amplifying circuit 11 is input to the offset correcting circuit 14, and one signal (first signal) constituting this differential input signal and the peak value of the first signal that has been detected and held after inputting the first signal to the first peak detecting circuit 13a, are input as a first differential signal to the non-inverting input terminal and inverting input terminal of one (first) differential input terminal of the differential amplifying circuit 12. Similarly, the other signal (second signal) from the differential amplifying circuit 12 of the second voltage amplifying circuit 11 and the peak value of the second signal that has been detected and held after inputting the second signal to the second peak detecting circuit 13b, are input as a second differential signal to the non-inverting input terminal and inverting input terminal of the other (second) differential input terminal of the differential amplifying circuit 12.

Therefore, according to the present embodiment, it is possible to effectively cancel an offset by employing the above-described configuration, thereby suppressing duty ratio deterioration.

It should be noted that in the present embodiment, the offset correcting circuit 14 was additionally arranged in a configuration in which one second voltage amplifying circuit 11 is cascade-connected in the subsequent stage of the first voltage amplifying circuit 8; however, the offset correcting circuit 14 may of course be employed in a configuration that includes two or more second voltage amplifying circuits 11, or a configuration that includes only the first voltage amplifying circuit 8 while not providing this second voltage amplifying circuit.

Embodiment 7

Figure 8:
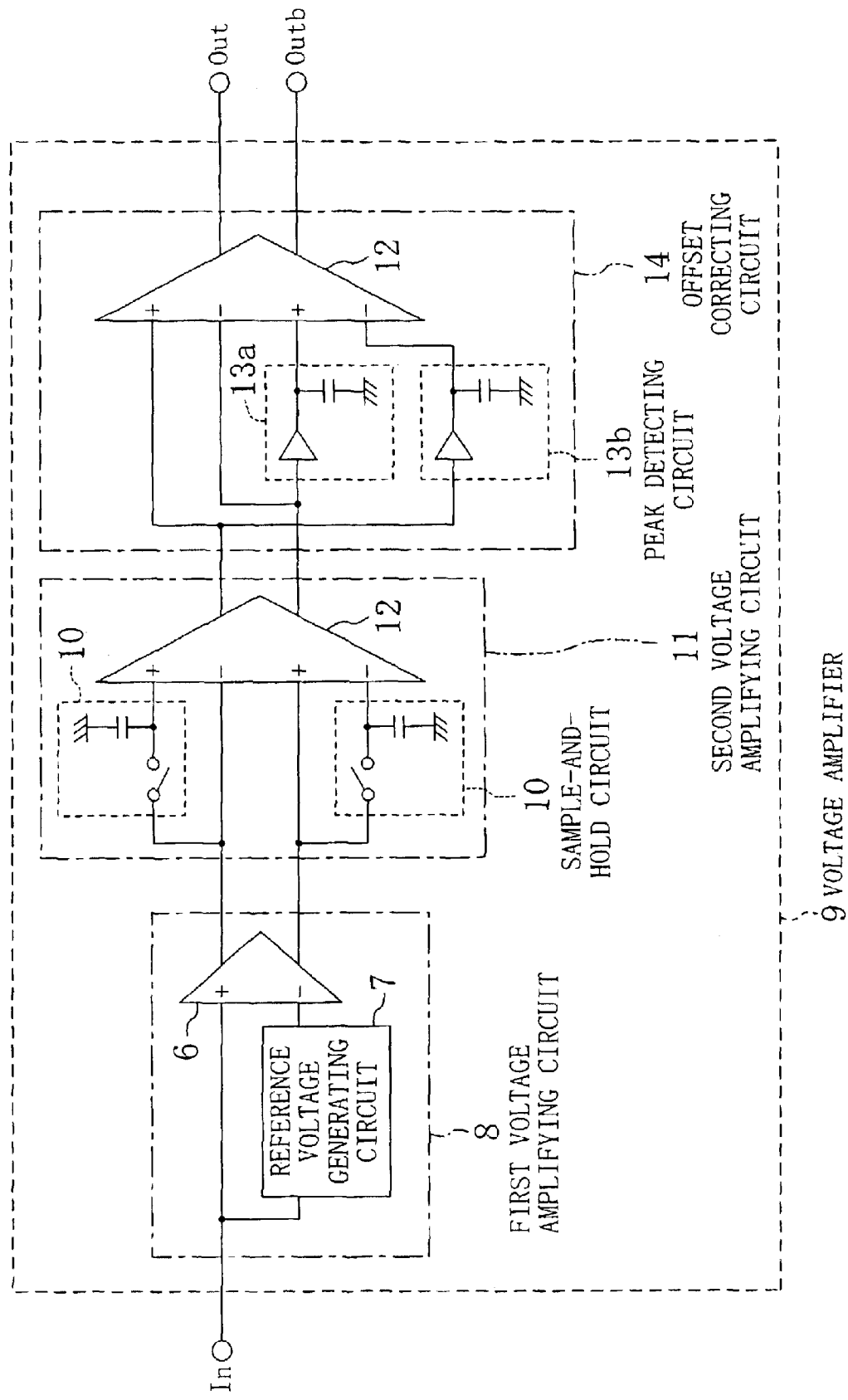
FIG. 8 is a diagram showing a voltage amplifier according to Embodiment 7 of the present invention.

FIG. 8 shows a voltage amplifier according to Embodiment 7 of the present invention.

In the present embodiment, although the offset correcting circuit 14 is arranged in the final stage as with Embodiment 6 shown in FIG. 7, the two peak detecting circuits 13a and 13b of this offset correcting circuit 14 are arranged in positions different from those shown in FIG. 7.

More specifically, in the configuration shown in FIG. 8, the differential signal of the differential amplifying circuit 12 of the second differential amplifying circuit 11 is directly input as the first differential signal to one differential input terminal (first differential input terminal) of the differential amplifying circuit 12 of the offset correcting circuit 14, and is also input to the first and second peak detecting circuits 13a and 13b, which detect and hold peak values, and the peak values are input as the second differential signal to the other differential input terminal (second differential input terminal) of the above-mentioned differential amplifying circuit 12.

Therefore, according to the present embodiment, it is also possible to readily cancel an offset by employing the above-described configuration, as with Embodiment 6.

The output of each of the differential amplifying circuit 6 of the first voltage amplifying circuit 8, the differential amplifying circuit 12 of the second voltage amplifying circuit 11 and the differential amplifying circuit 12 of the offset correcting circuit 14, is amplitude-limited. Accordingly, saturation of input signals having large amplitudes can be prevented, so that is possible to obtain an output with little duty ratio deterioration. It should be noted that this amplitude limitation may also be employed for the differential amplifying circuits 6 and 12 shown in FIGS. 4 to 7.

Embodiment 8

Figure 9:
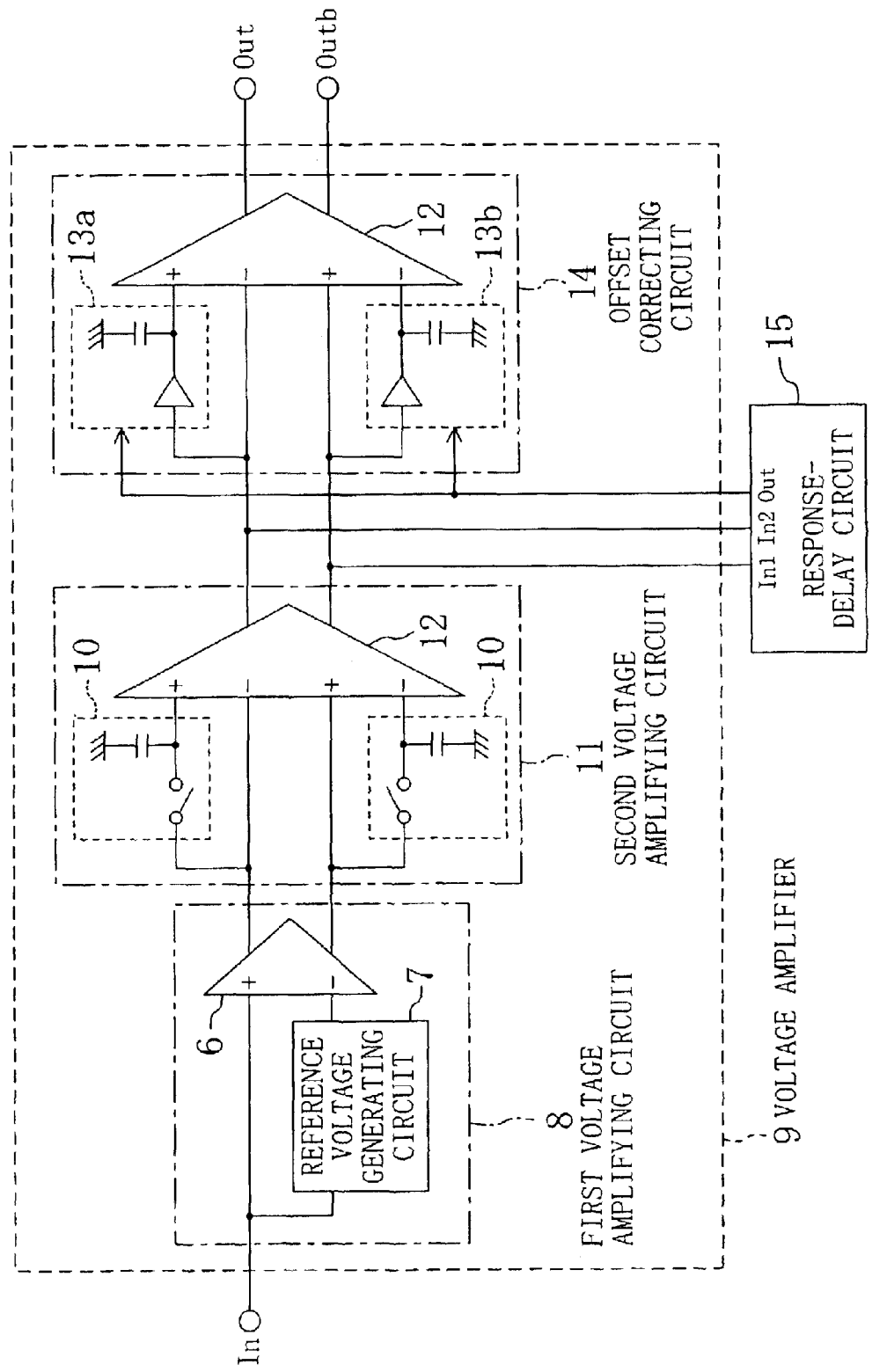
FIG. 9 is a diagram showing a voltage amplifier according to Embodiment 8 of the present invention.

FIG. 9 shows a voltage amplifier according to Embodiment 8 of the present invention For the normal operation of the offset correcting circuits 14 according to Embodiments 6 and 7, the peak values of two input signals must be accurately detected and held. However, as indicated by the symbol A in FIG. 13, the peak value of the first bit of this actual waveform is larger than a peak value obtained if the peak value of the first bit were normal. The reason is that the peak value of the first bit is increased because there is a time delay until the generation of the reference voltage Vref in the amplifying circuits in the previous stages. In this case, since an offset cannot be cancelled normally, significant duty ratio deterioration may be caused if this signal is directly converted to a logic level all at once with a comparator or the like.

Thus, in the present embodiment, a response-delay circuit 15 is arranged so as to eliminate the influence of an abnormal peak value of the first bit. This response-delay circuit 15 monitors the input differential signals from the differential amplifying circuit 12 of the second voltage amplifying circuit 11 to the offset correcting circuit 14, thereby serving to delay the detecting and holding operation of the two peak detecting circuits 13a and 13b of the offset correcting circuit 14 such that the peak detecting circuits 13a and 13b detect and hold peak values of the second or later bits of the input signals.

Figure 14:
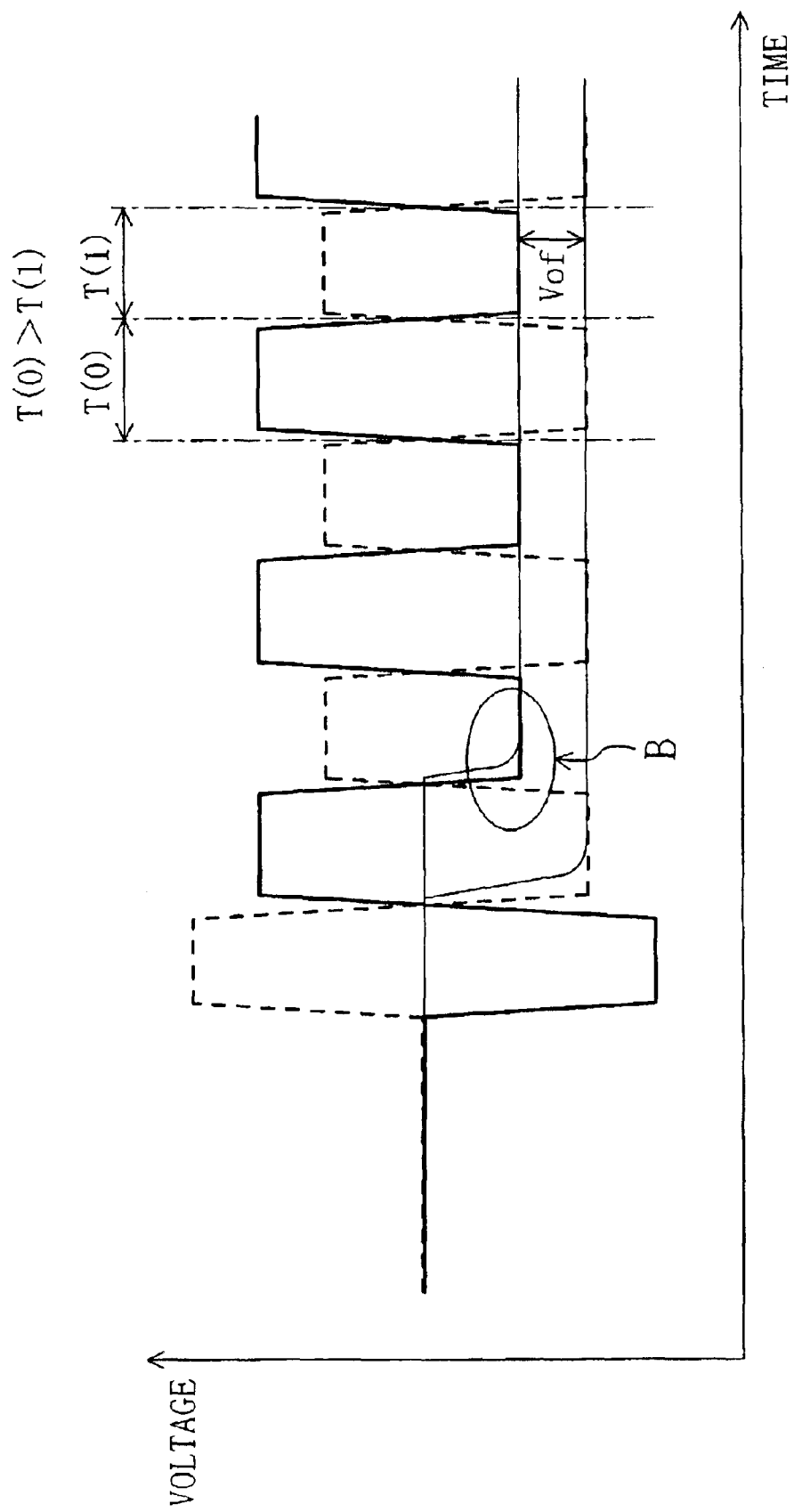
FIG. 14 is a graph showing an effect based on the operation of a response-delay circuit of the voltage amplifier according to Embodiment 8 of the present invention.

Therefore, according to the present embodiment, as indicated by the symbol B in FIG. 14, it is possible to detect a normal peak value of the second or later bits by using the response-delay circuit 15, even when there is an abnormal peak in the first bit.

Embodiment 9

Figure 10:
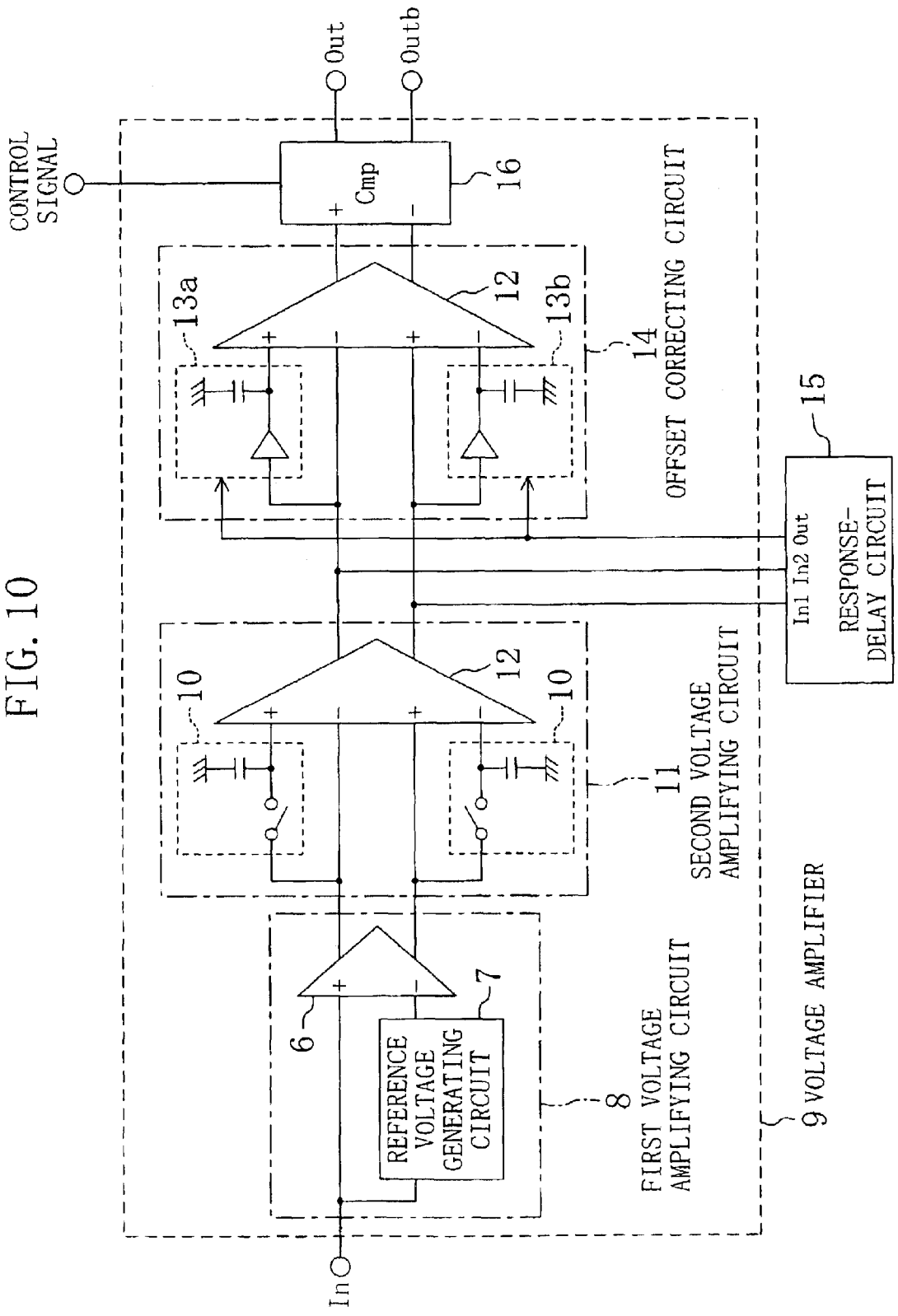
FIG. 10 is a diagram showing a voltage amplifier according to Embodiment 9 of the present invention.

FIG. 10 shows a voltage amplifier according to Embodiment 9 of the present invention. The feature of the present embodiment lies in the arrangement of a comparator 16 in the final stage.

In the present embodiment, the output signals of the differential amplifying circuit 12 of the offset correcting circuit 14 are analog signals, whose amplitudes are not constant. However, the comparator 16 arranged in the subsequent stage amplifies and converts the differential voltages of the differential amplifying circuit 12 of the offset correcting circuit 14 into digital signals having amplitudes at a constant logic level, and outputs the digital signals from output terminals Out and Outb.

Further, the comparator 16 is configured so as to receive a control signal and to fix the output voltage values from the output terminals Out and Outb by using this control signal. With this configuration, it is possible to prevent the output signals from the output terminals Out and Outb from oscillating in the reset period or the like.

Embodiment 10

Figure 11:
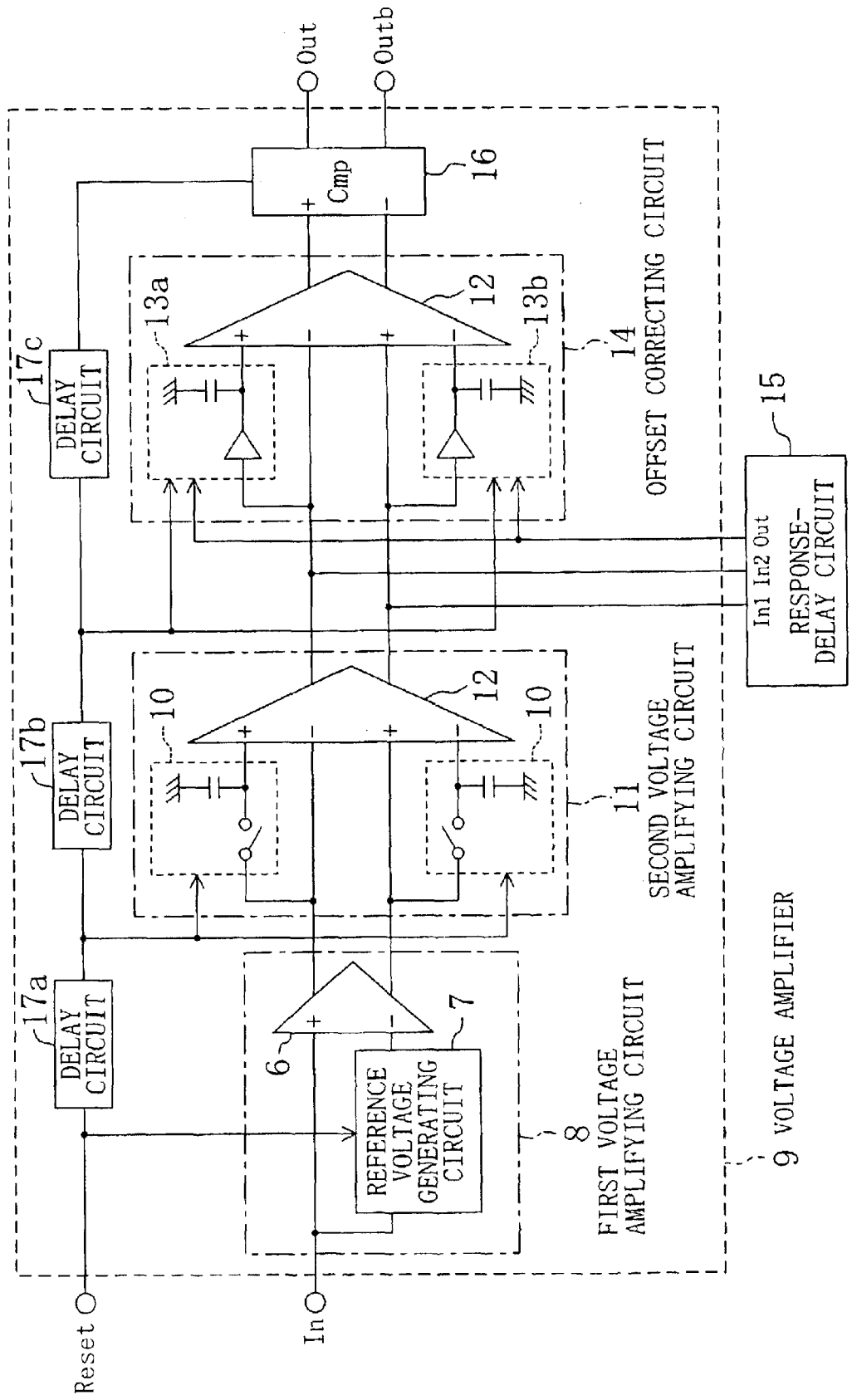
FIG. 11 is a diagram showing a voltage amplifier according to Embodiment 10 of the present invention.

FIG. 11 shows a voltage amplifier according to Embodiment 10 of the present invention.

In the figure, a reset signal is input to the reference voltage generating circuit 7 of the first voltage amplifying circuit 8. This reset signal is also time-delayed by a delay circuit 17a for a predetermined time, and then input as a control signal to the sample-and-hold circuits 10 of the second voltage amplifying circuit 11. The reset signal delayed by the delay circuit 17a is time-delayed further by another delay circuit 17b for a predetermined time, and then input to the first and second peak detecting circuits 13a and 13b of the offset correcting circuit 14. This reset signal is also time-delayed further by a delay circuit 17c arranged in the subsequent stage of the delay circuit 17b, and then input as a control signal to the comparator 16.

Therefore, according to the present embodiment, it is possible to reset a subsequent stage after completing the reset operation of the previous stage, thereby realizing a stable operation.

It should be noted that although the present embodiment was employed for the voltage amplifier shown in FIG. 10, it may, of course, be similarly employed for the voltage amplifiers shown in FIGS. 5 to 9.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A reference voltage generating circuit, comprising a capacitor string including a cascade connection of a plurality of capacitors, wherein:

a signal is input, a maximum peak value or minimum peak value of the input signal is detected and held as a first peak value on one end of the capacitor string during a first period, a minimum peak value or maximum peak value of the input signal is detected and held as a second peak value on the other end of the capacitor string during a second period, which is different from the first period, and a voltage between the first peak value and the second peak value is output as a reference voltage from a predetermined position in the capacitor string.

2. The reference voltage generating circuit according to claim 1, comprising:

a first capacitor, wherein:

the capacitor string includes a cascade connection of a second and a third capacitor, one end of the second capacitor being connected to the first capacitor, and the other end of the second capacitor being connected to one end of the third capacitor, the first peak value is held in the one end of the second capacitor connected to the first capacitor in the capacitor string, the second peak value is held in the other end of the third capacitor in the capacitor string, and a voltage difference between the first peak value and the second peak value is held in the capacitor string; and a voltage between the one end and the other end of the second capacitor in the capacitor string is added to a voltage held in the first capacitor, and the resulting voltage is output as a reference voltage.

3. The reference voltage generating circuit according to claim 2, wherein a capacitance value of the second capacitor and a capacitance value of the third capacitor are equal.

4. The reference voltage generating circuit according to claim 2, wherein the first capacitor and the capacitor string are cascade-connected.

5. The reference voltage generating circuit according to claim 4, wherein a capacitance value of the first capacitor is sufficiently larger than the capacitance values of the second and the third capacitors.

6. A reference voltage generating circuit comprising:

a first capacitor;

a capacitor string comprising a cascade connection of a second and a third capacitor;

a voltage/current converting circuit for outputting a current corresponding to a voltage difference between two input voltages input to two input terminals;

a unidirectionally-conductive element for passing a current only in one direction;

a buffer circuit; and first and second reset circuits, wherein:

an output terminal of the voltage/current converting circuit is connected to one end of the unidirectionally-conductive element;

the other end of the unidirectionally-conductive element is connected to one end of the capacitor string and to an input terminal of the buffer circuit;

the other end of the capacitor string is connected to one end of the first capacitor;

a predetermined voltage is applied to the other end of the first capacitor;

an output terminal of the buffer circuit is connected to one of the input terminals of the voltage/current converting circuit, and a signal is input to the other of the input terminals of the voltage/current converting circuit;

the first reset circuit discharges an electric charge of the first capacitor; and the second reset circuit discharges electric charges of the second and third capacitors constituting the capacitor string.

7. A reference voltage generating circuit comprising:

a voltage generating circuit for generating a predetermined voltage; and a capacitor string comprising a cascade connection of two capacitors, wherein:

one end of the capacitor string is connected to an output terminal of the voltage generating circuit, and a peak value of an input signal is detected and held on the other end of the capacitor string; and a voltage at a node connecting the two capacitors constituting the capacitor string is output as a reference voltage.

8. The reference voltage generating circuit according to claim 7, wherein capacitance values of the two capacitors constituting the capacitor string are equal to each other.

9. A reference voltage generating circuit comprising:

a voltage generating circuit for generating a predetermined voltage;

a capacitor string comprising a cascade connection of two capacitors;

a voltage/current converting circuit for outputting a current corresponding to a voltage difference between two input voltages input to two input terminals;

a unidirectionally-conductive element for passing a current only in one direction;

a buffer circuit; and a reset circuit, wherein:

an output terminal of the voltage/current converting circuit is connected to one end of the unidirectionally-conductive element;

the other end of the unidirectionally-conductive element is connected to one end of the capacitor string and to an input terminal of the buffer circuit;

the other end of the capacitor string is connected to an output terminal of the voltage generating circuit;

an output terminal of the buffer circuit is connected to one of the input terminals of the voltage/current converting circuit;

a signal is input to the other of the input terminals of the voltage/current converting circuit; and the reset circuit discharges electric charges of the two capacitors constituting the capacitor string.

10. A voltage amplifier comprising:

the reference voltage generating circuit according to claim 1 or 7; and a differential amplifying circuit for outputting an output voltage corresponding to a voltage difference between two input voltages input to two input terminals, wherein:

an input signal is applied to the reference voltage generating circuit and to one of the input terminals of the differential amplifying circuit; and a reference voltage output from the reference voltage generating circuit is applied to the other of the input terminals of the differential amplifying circuit.

11. A voltage amplifier comprising:

the voltage amplifier according to claim 10 serving as a first voltage amplifying circuit; and at least one second voltage amplifying circuit, wherein:

the second voltage amplifying circuit comprises a sample-and-hold circuit and a differential amplifying circuit;

an input voltage to the second voltage amplifying circuit is applied to the sample-and-hold circuit and to one of the input terminals of the differential amplifying circuit; and an output voltage from the sample-and-hold circuit is applied to the other of the input terminals of the differential amplifying circuit.

12. The voltage amplifier according to claim 11, wherein the one second voltage amplifying circuit or a plurality of cascade-connected second voltage amplifying circuits are cascade-connected in a stage subsequent to the first voltage amplifying circuit.

13. The voltage amplifier according to claim 11, further comprising an offset correcting circuit, wherein the offset correcting circuit is cascade-connected in a final stage.

14. The voltage amplifier according to claim 13, wherein the offset correcting circuit comprises:

a differential amplifying circuit having a first and a second differential input terminal; and a first and a second peak detecting circuit, wherein:

a first and a second signals are input;

a peak value of the first input signal is detected and held by the first peak detecting circuit, and the first input signal and its peak value are input as a first differential signal to the first differential input terminal of the differential amplifying circuit; and a peak value of the second input signal is detected and held by the second peak detecting circuit, and the second input signal and its peak value are input as a second differential signal to the second differential input terminal of the differential amplifying circuit.

15. The voltage amplifier according to claim 13, wherein the offset correcting circuit comprises:

a differential amplifying circuit having a first and a second differential input terminal; and a first and a second peak detecting circuit, wherein:

a first and a second signals are input;

the first and second input signals are input as a first differential signal to the first differential input terminal of the differential amplifying circuit, and peak values of the first and second input signals are detected and held by the first and second peak detecting circuits, respectively, and output signals of the first and second peak detecting circuits are input as a second differential signal to the second input terminal of the differential amplifying circuit.

16. The voltage amplifier according to claim 14 or 15, wherein a response-delay circuit for delaying detection and holding of the peak values of the first and second input signals is connected to the first and second peak detecting circuits of the offset correcting circuit.

17. The voltage amplifier according to claim 10, further comprising a comparator, wherein the comparator is configured so as to be able to amplify a differential voltage input to the comparator to a voltage having a constant amplitude, and also to receive a control signal and fix its output voltage value.

18. The voltage amplifier according to claim 10, wherein an output of the differential amplifying circuit is amplitude-limited.

19. The voltage amplifier according to claim 11 or 12, comprising:

a delay circuit, wherein the delay circuit provides a time delay between a reset signal to the reference voltage generating circuit of the first voltage amplifying circuit and a control signal of the sample-and-hold circuit of the second voltage amplifying circuit.

20. The voltage amplifier according to claim 14 or 15, comprising a delay circuit, wherein the delay circuit provides a time delay between a control signal of the sample-and-hold circuit of the second voltage amplifying circuit and a reset signal for the first and second peak detecting circuits of the offset correcting circuit.

21. The voltage amplifier according to claim 17, comprising a delay circuit, wherein the delay circuit provides a time delay between a reset signal for the first and second peak detecting circuits of the offset correcting circuit and a control signal of the comparator.

* * * * *